(12) United States Patent
D'Evelyn et al.

(10) Patent No.: US 10,100,425 B2
(45) Date of Patent: Oct. 16, 2018

(54) METHOD FOR SYNTHESIS OF HIGH QUALITY LARGE AREA BULK GALLIUM BASED CRYSTALS

(71) Applicant: SLT TECHNOLOGIES, INC., Los Angeles, CA (US)

(72) Inventors: Mark P. D'Evelyn, Fremont, CA (US); James S. Speck, Fremont, CA (US)

(73) Assignee: SLT TECHNOLOGIES, INC., Los Angeles, CA (US)

( * ) Notice: Subject to any disclaimer, the term of this patent is extended or adjusted under 35 U.S.C. 154(b) by 343 days.

(21) Appl. No.: 14/930,170

(22) Filed: Nov. 2, 2015

(65) Prior Publication Data
US 2016/0053400 A1    Feb. 25, 2016

Related U.S. Application Data

(62) Division of application No. 12/988,772, filed as application No. PCT/US2010/052175 on Oct. 11, 2010, now Pat. No. 9,175,418.

(60) Provisional application No. 61/250,476, filed on Oct. 9, 2009.

(51) Int. Cl.
| | | |
|---|---|---|
| C30B 1/10 | (2006.01) |
| C30B 7/10 | (2006.01) |
| C30B 25/02 | (2006.01) |
| C30B 29/40 | (2006.01) |
| C30B 7/00 | (2006.01) |
| H01L 21/02 | (2006.01) |
| H01L 29/04 | (2006.01) |
| H01L 29/20 | (2006.01) |
| H01L 29/34 | (2006.01) |
| H01L 29/36 | (2006.01) |

(52) U.S. Cl.
CPC ............. *C30B 7/105* (2013.01); *C30B 7/005* (2013.01); *C30B 25/02* (2013.01); *C30B 29/403* (2013.01); *C30B 29/406* (2013.01); *H01L 21/0254* (2013.01); *H01L 21/02645* (2013.01); *H01L 21/02647* (2013.01); *H01L 29/045* (2013.01); *H01L 29/2003* (2013.01); *H01L 29/34* (2013.01); *H01L 29/36* (2013.01)

(58) Field of Classification Search
CPC combination set(s) only.
See application file for complete search history.

(56) References Cited

U.S. PATENT DOCUMENTS

| | | | | |
|---|---|---|---|---|
| 6,596,079 B1 * | 7/2003 | Vaudo | ............... | C30B 23/00 117/101 |
| 2005/0098095 A1 * | 5/2005 | D'Evelyn | ............... | B82Y 10/00 117/105 |
| 2008/0156254 A1 * | 7/2008 | Dwilinski | ............... | B82Y 20/00 117/1 |
| 2008/0191223 A1 * | 8/2008 | Nakamura | ............... | B82Y 20/00 257/95 |

(Continued)

*Primary Examiner* — Erin F Bergner
(74) *Attorney, Agent, or Firm* — Patterson & Sheridan, LLP

(57) ABSTRACT

A large area nitride crystal, comprising gallium and nitrogen, with a non-polar or semi-polar large-area face, is disclosed, along with a method of manufacture. The crystal is useful as a substrate for a light emitting diode, a laser diode, a transistor, a photodetector, a solar cell, or for photoelectrochemical water splitting for hydrogen generation.

20 Claims, 11 Drawing Sheets

(56) References Cited

U.S. PATENT DOCUMENTS

2009/0072352 A1* 3/2009 Hashimoto ............... C30B 7/10
257/615

* cited by examiner

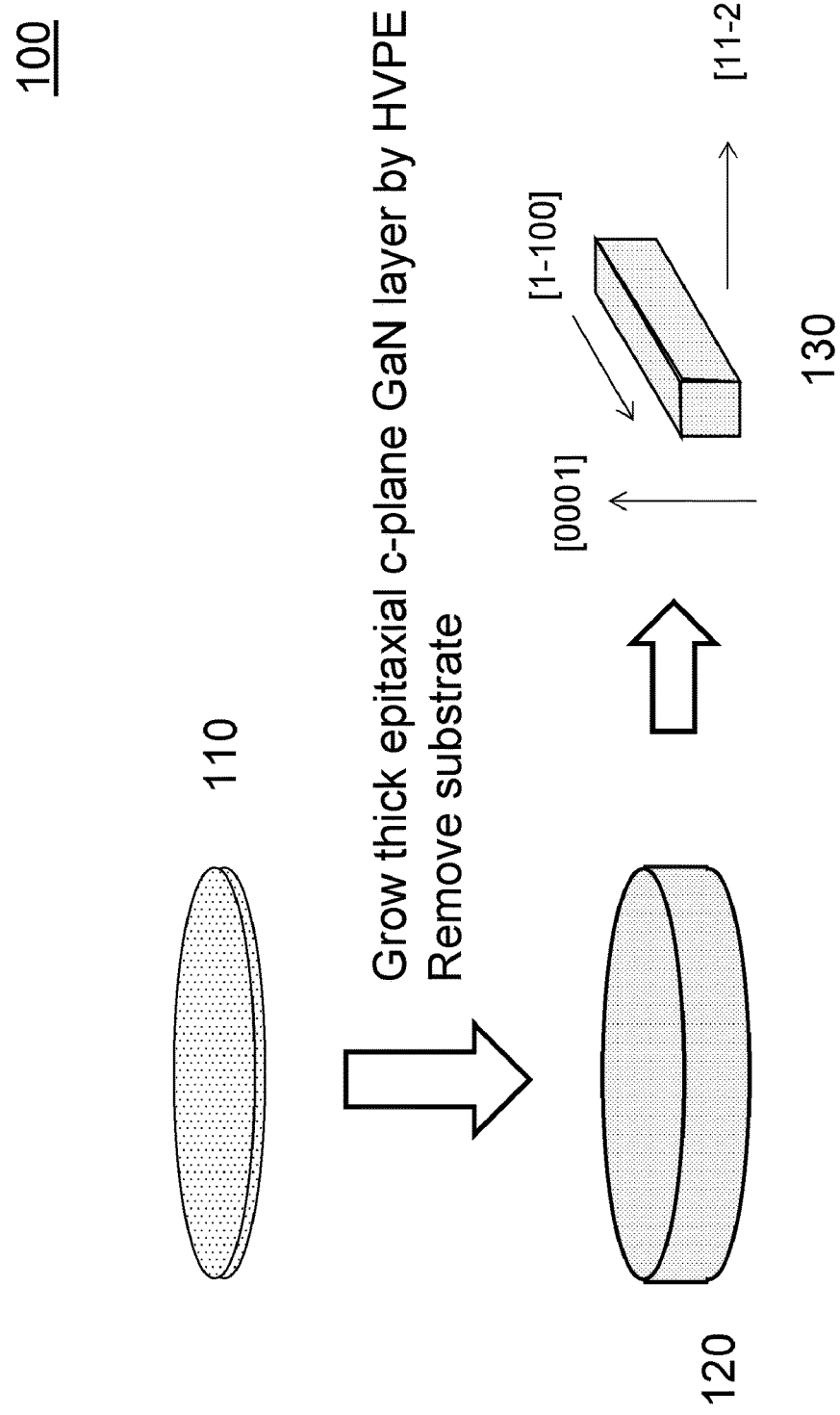
Fig. 1a – Proto-seed

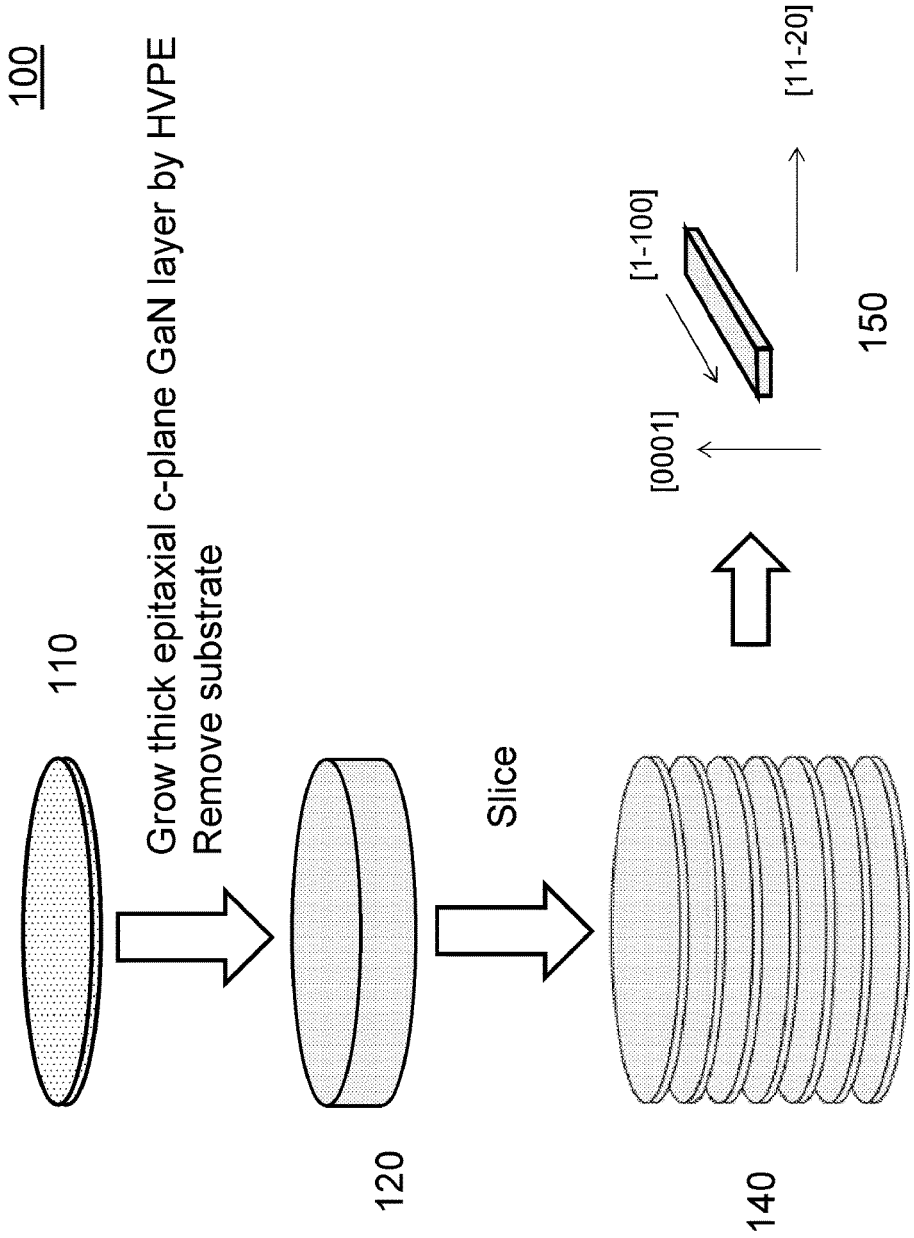

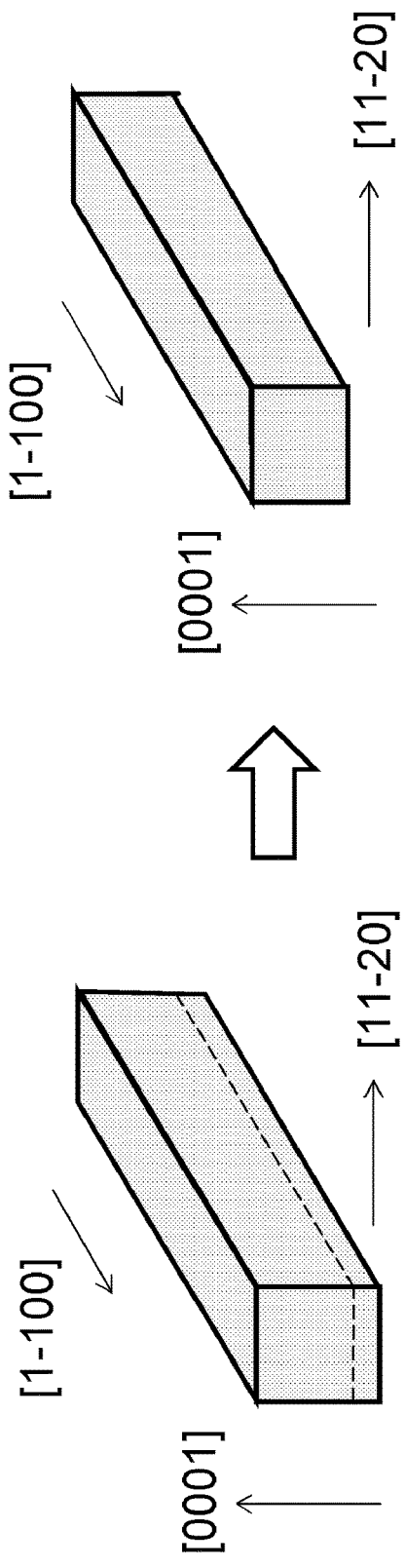
Fig. 2 – Optional step: trim –c edge

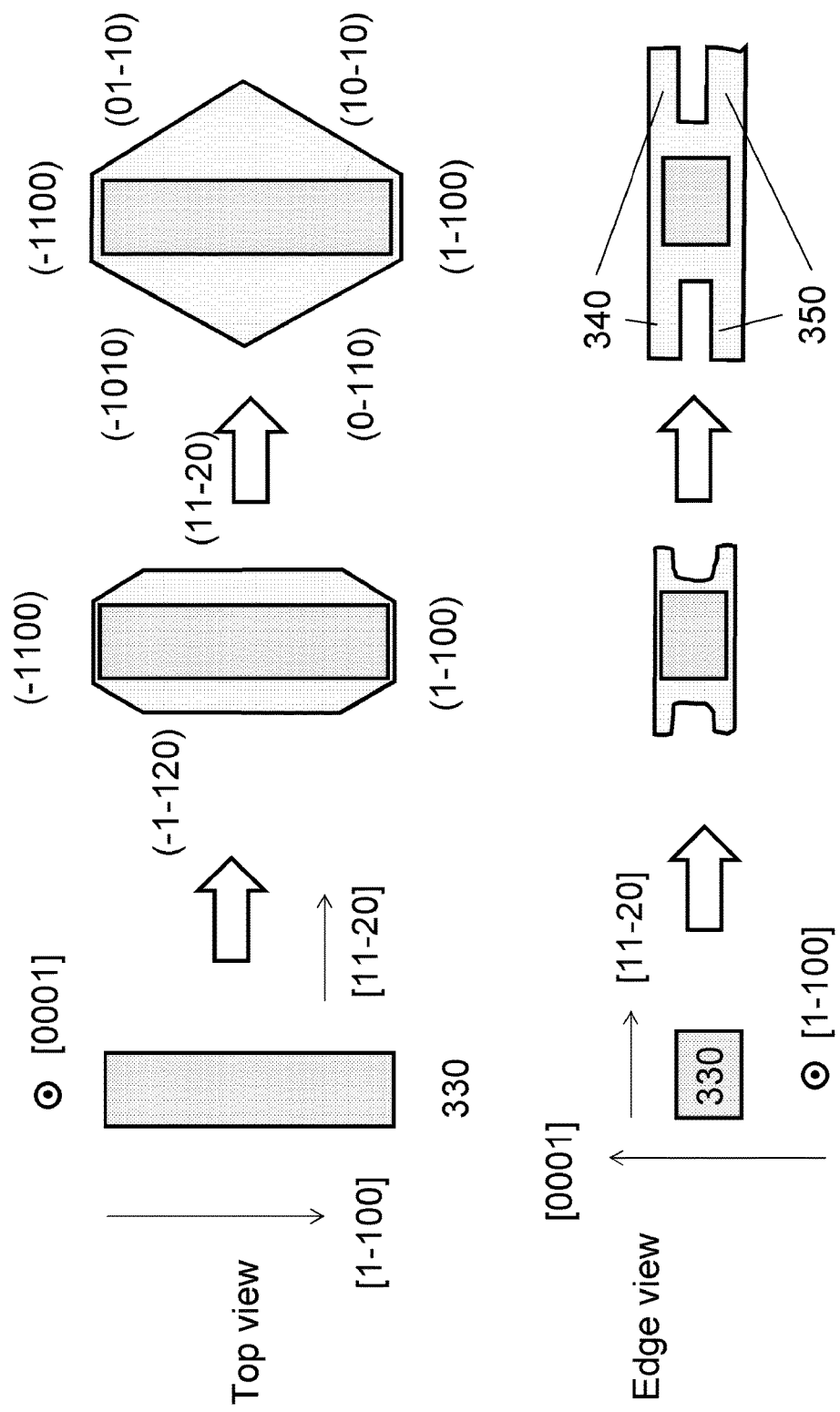
Fig. 3 – A-direction growth

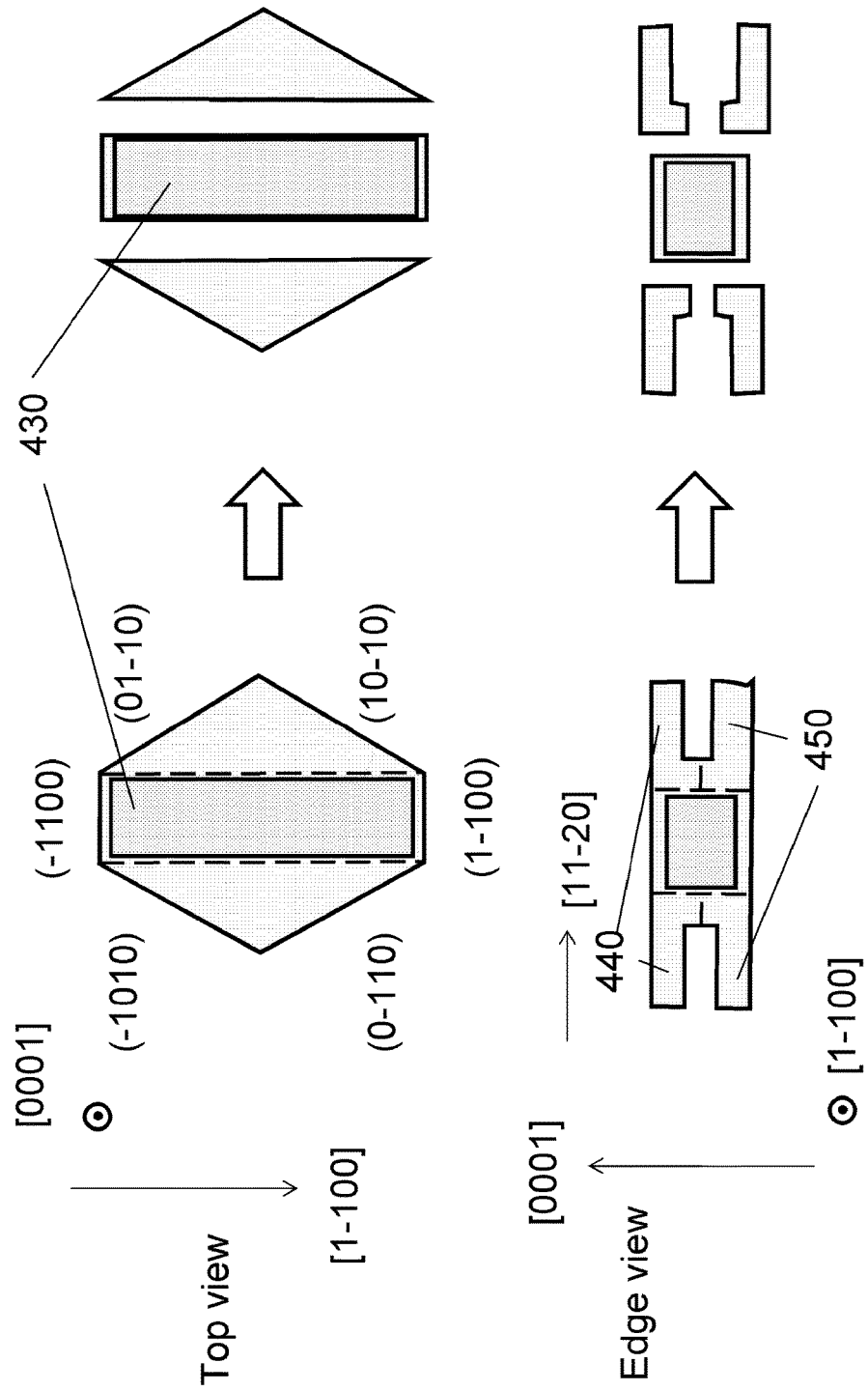
Fig. 4 – Separation

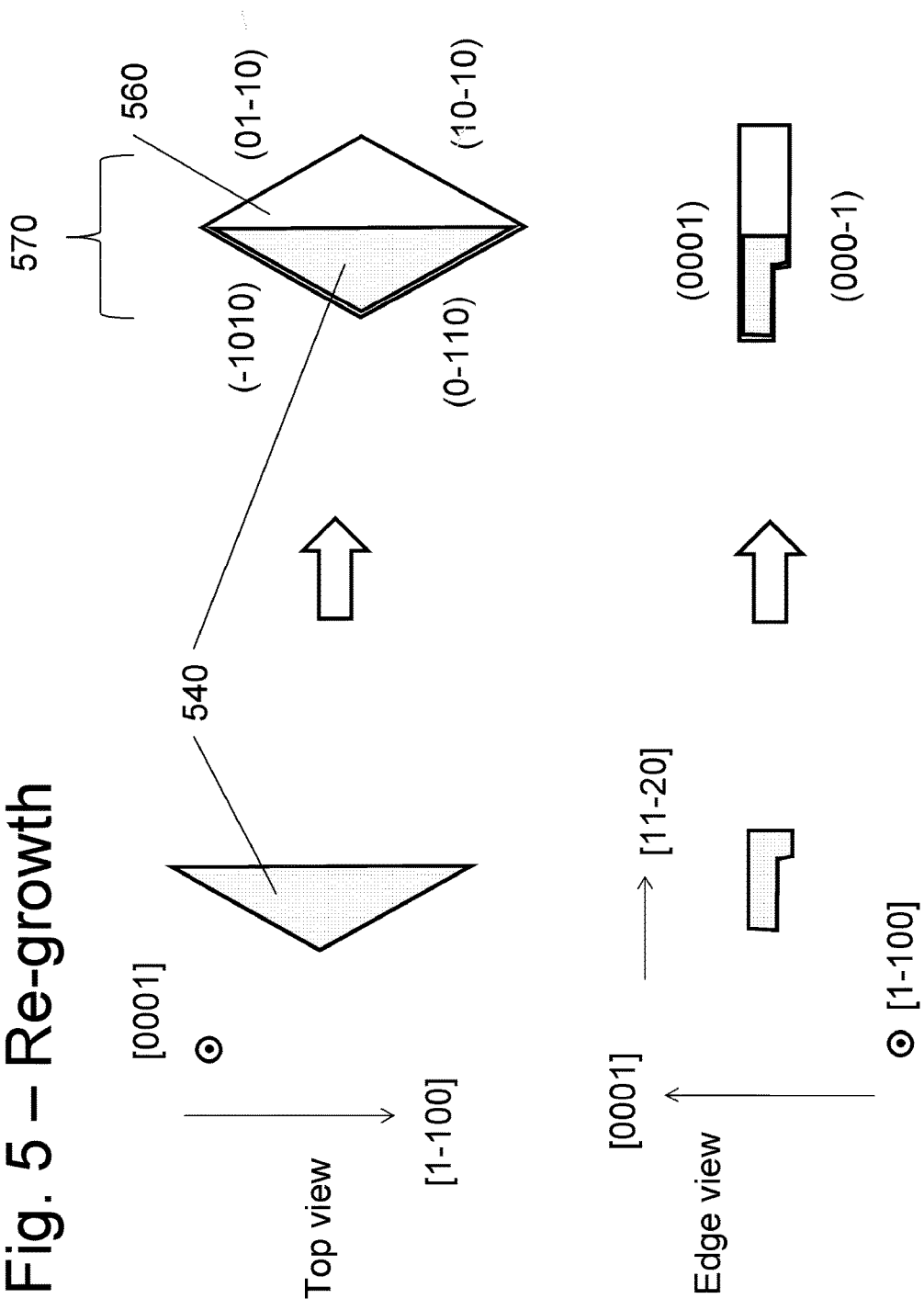
Fig. 5 – Re-growth

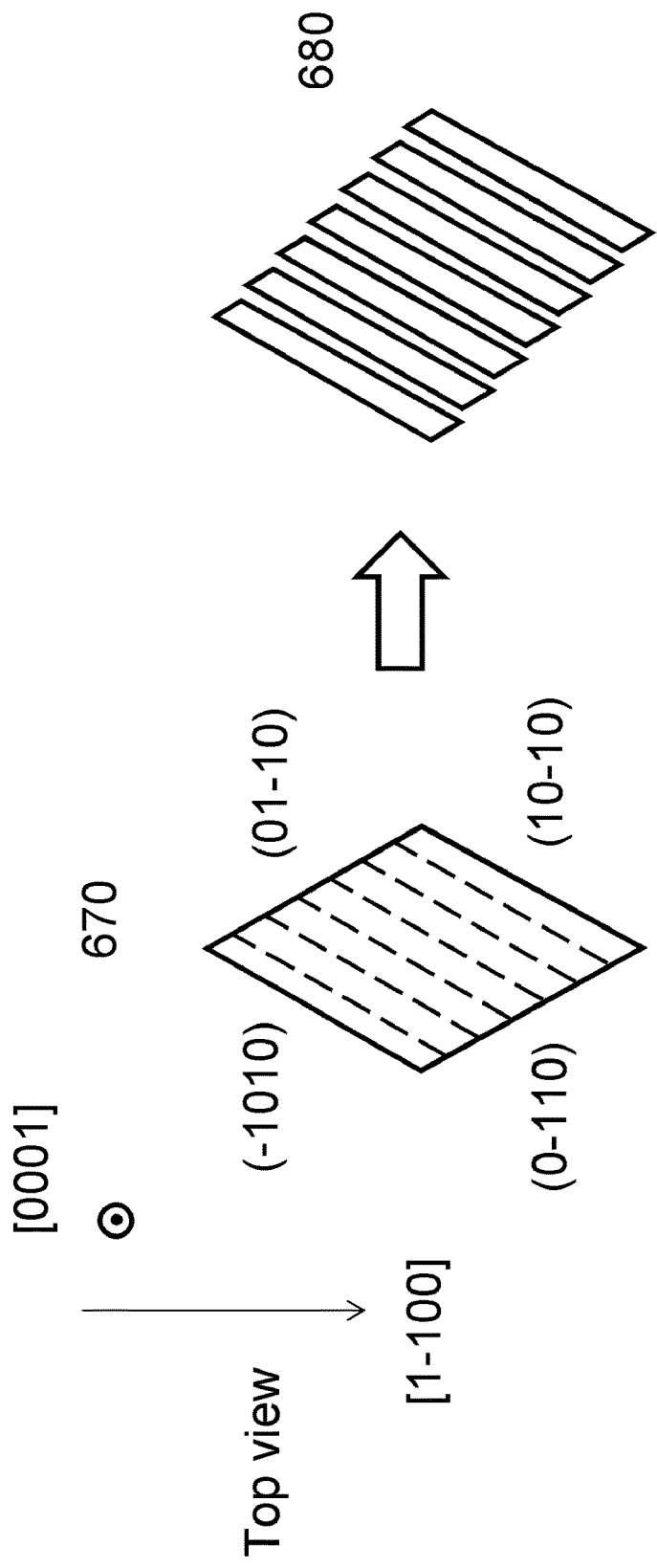
Fig. 6 – Optional separation

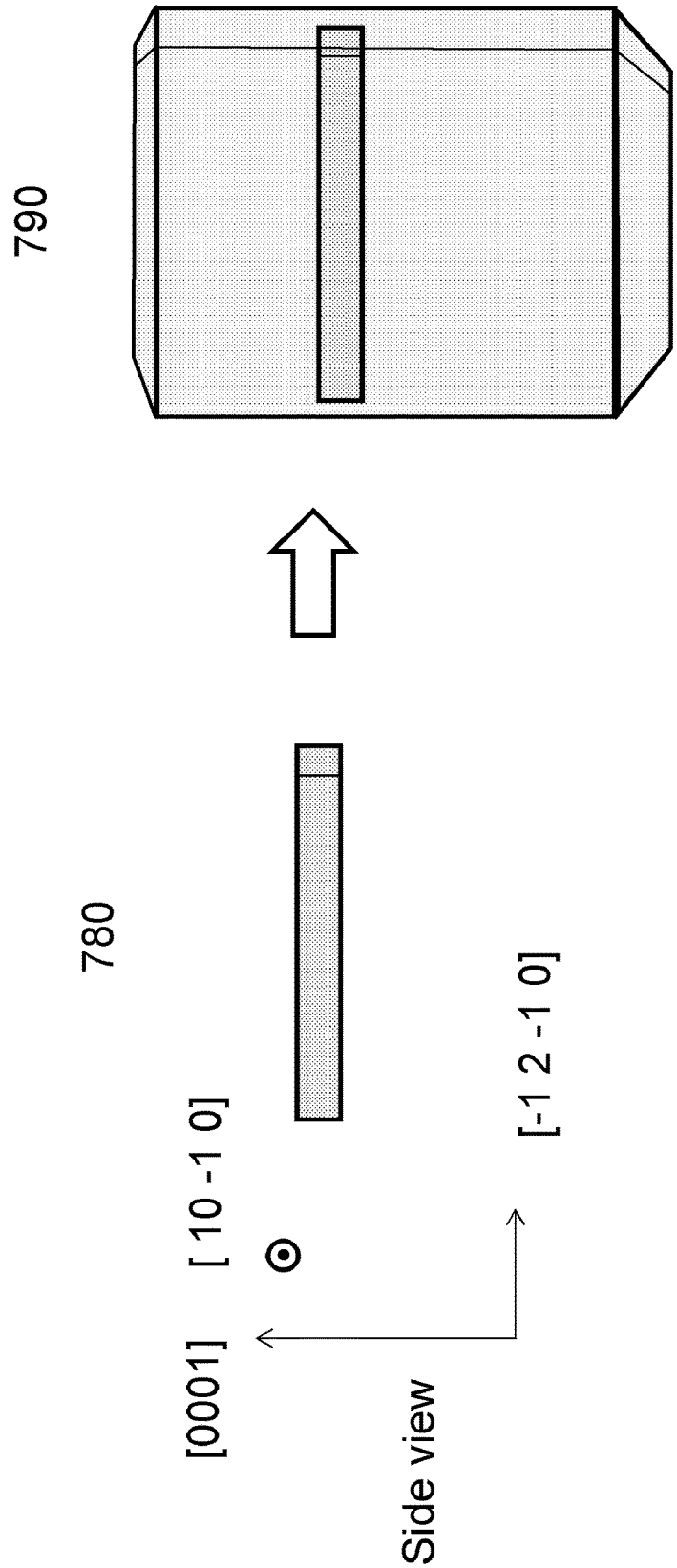
Fig. 7a – C-direction growth

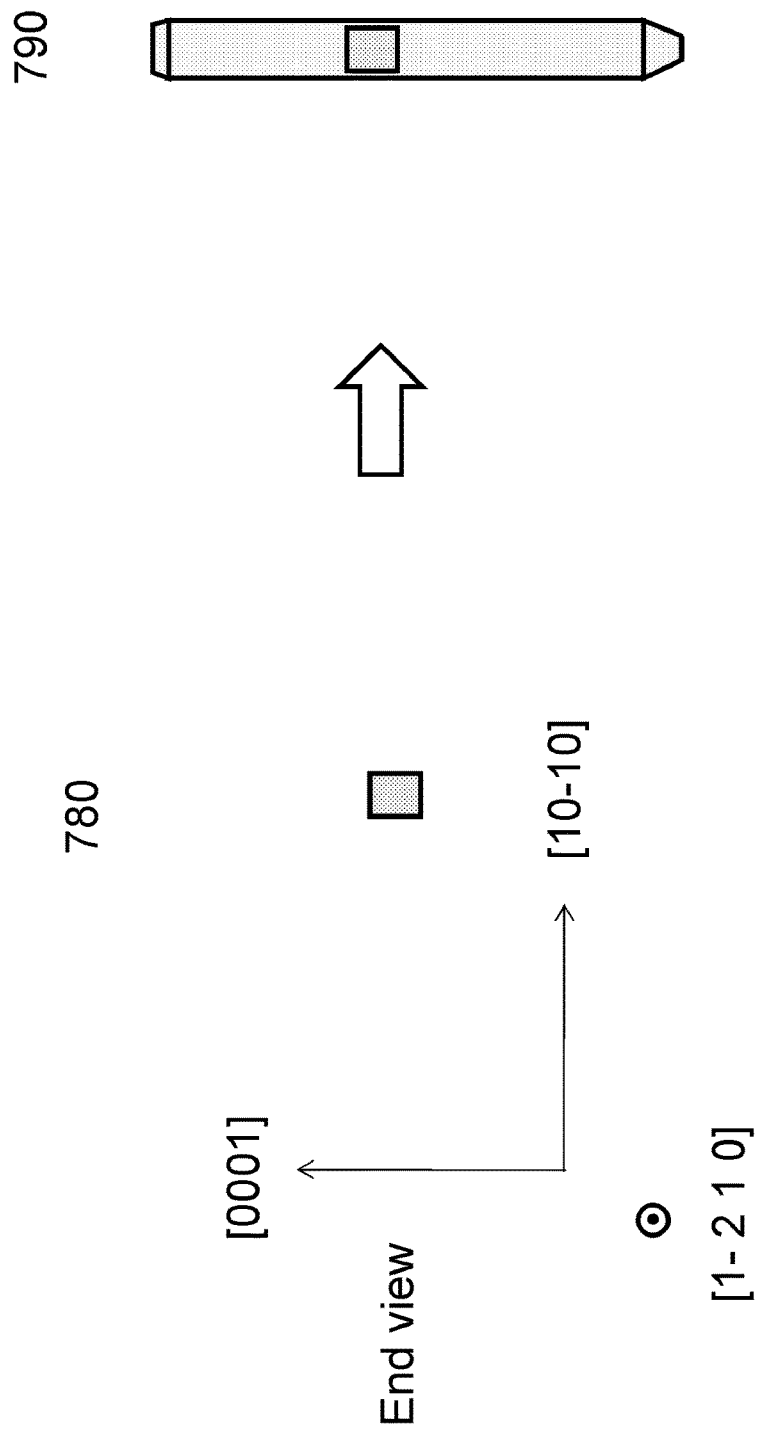

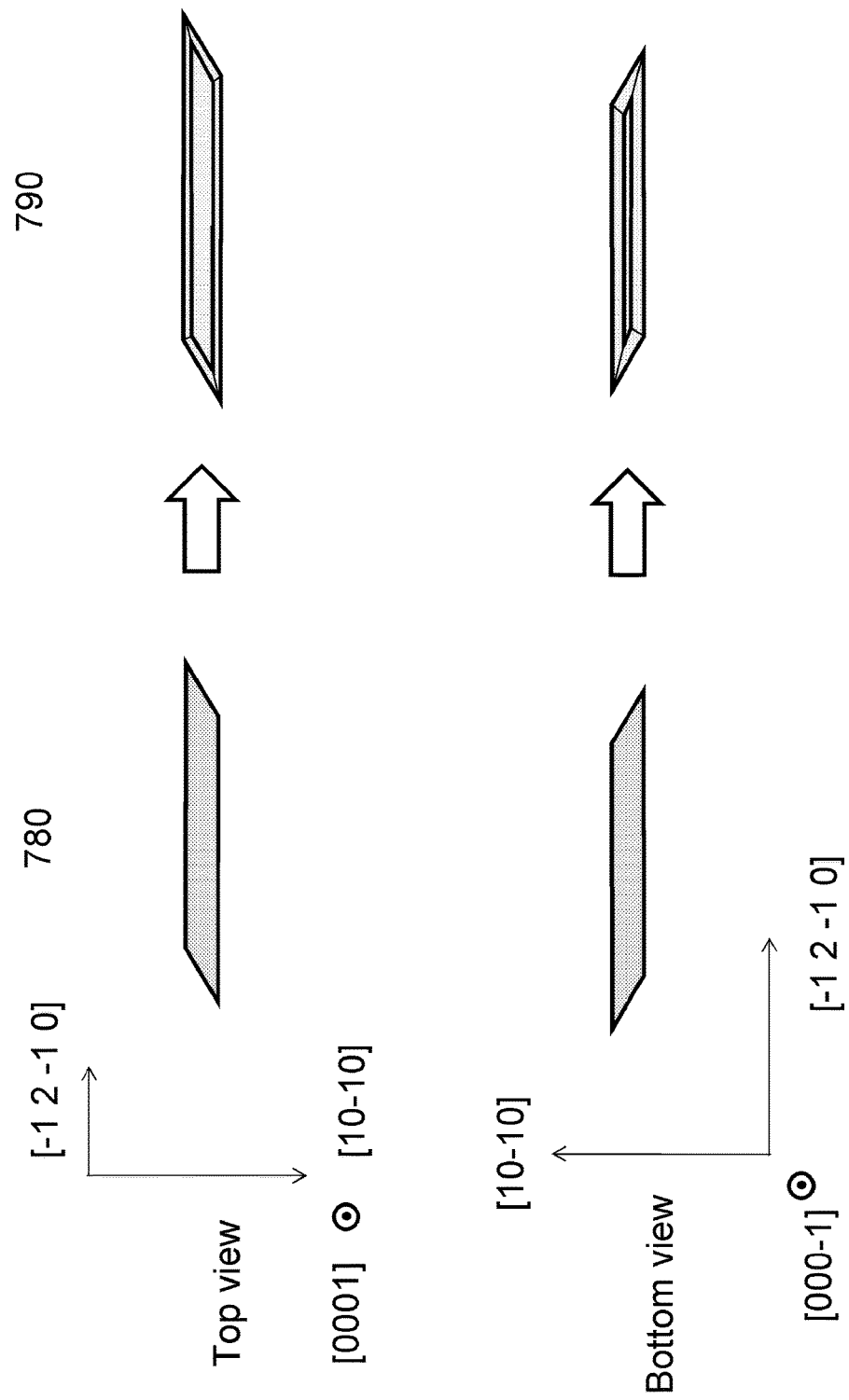

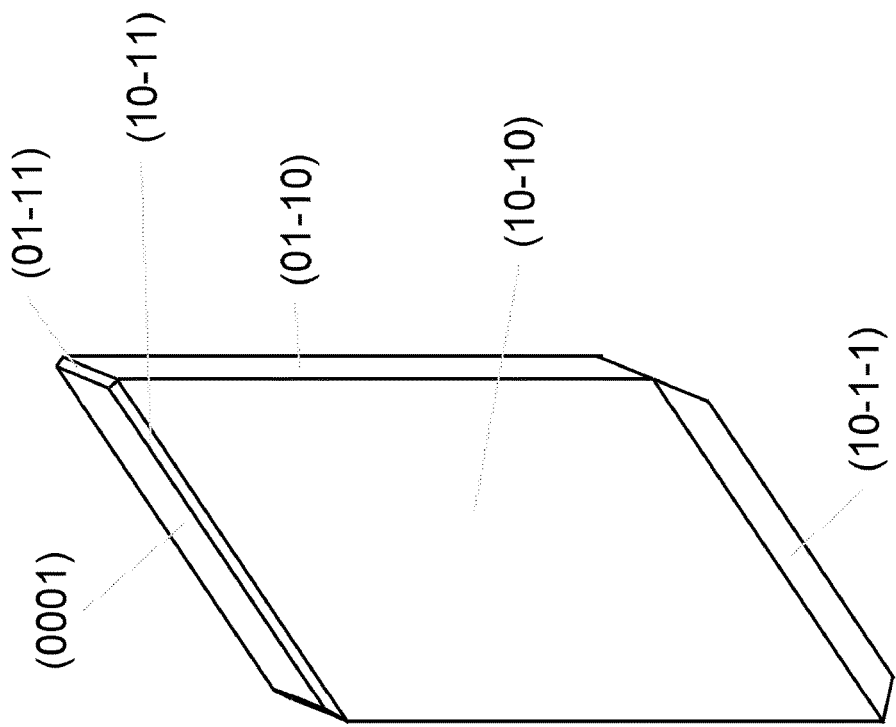
Fig. 8 – Morphology of grown crystal

METHOD FOR SYNTHESIS OF HIGH QUALITY LARGE AREA BULK GALLIUM BASED CRYSTALS

CROSS-REFERENCE TO RELATED APPLICATION

This application is a division of U.S. patent application Ser. No. 12/988,772, filed Jun. 30, 2011, now allowed, which is a '371 national phase application of PCT/US10/52175, filed Oct. 11, 2010, which claims the benefit of U.S. Provisional No. 61/250,476, filed Oct. 9, 2009, commonly assigned, and hereby incorporated by reference herein.

BACKGROUND OF THE INVENTION

This invention relates generally to techniques for processing materials for manufacture of gallium based substrates. More specifically, embodiments of the invention include techniques for growing large area substrates using a combination of processing techniques. The invention can be applied to growing crystals of GaN, AlN, InN, InGaN, AlGaN, and AlInGaN, and others for manufacture of bulk or patterned substrates. Such bulk or patterned substrates can be used for a variety of applications including optoelectronic devices, lasers, light emitting diodes, solar cells, photo electrochemical water splitting and hydrogen generation, photo detectors, integrated circuits, and transistors, and others.

Gallium nitride (GaN) based optoelectronic and electronic devices are of tremendous commercial importance. The quality and reliability of these devices, however, is compromised by high defect levels, particularly threading dislocations, grain boundaries, and strain in semiconductor layers of the devices. Dislocations can arise from lattice mismatch of GaN based semiconductor layers to a non-GaN substrate such as sapphire or silicon carbide. Grain boundaries can arise from the coalescence fronts of epitaxially-overgrown layers. Additional defects can arise from thermal expansion mismatch, impurities, and tilt boundaries, depending on the details of the growth method of the layers.

The presence of defects has a deleterious effect on epitaxially-grown layers. Such effect includes compromising electronic device performance. To overcome these defects, techniques have been proposed that require complex, tedious fabrication processes to reduce the concentration and/or impact of the defects. While a substantial number of conventional growth methods for gallium nitride crystals have been proposed, limitations still exist. That is, conventional methods still merit improvement to be cost effective and efficient.

Progress has been made in the growth of large-area c-plane gallium nitride crystals, typically with a (0001) orientation. The large-area c-plane gallium nitride crystals generally come in 2 inch diameter, free-standing (0001) GaN substrates and are generally available commercially. However, the quality of these crystals is not high enough for some applications. In addition, there is a need to synthesis gallium nitride crystals and wafers that are larger. Several conventional methods are capable of growing high quality gallium nitride boules from high quality gallium nitride seed crystals. However, gallium nitride seed crystals of sufficient size and quality are not available.

From the above, it is seen that techniques for improving crystal growth are highly desirable.

BRIEF SUMMARY OF THE INVENTION

According to the present invention, techniques related to techniques for processing materials for manufacture of gallium based substrates are provided. More specifically, embodiments of the invention include techniques for growing large area substrates using a combination of processing techniques. Merely by way of example, the invention can be applied to growing crystals of GaN, AlN, InN, InGaN, AlGaN, and AlInGaN, and others for manufacture of bulk or patterned substrates. Such bulk or patterned substrates can be used for a variety of applications including optoelectronic devices, lasers, light emitting diodes, solar cells, photo electrochemical water splitting and hydrogen generation, photodetectors, integrated circuits, and transistors, and others.

In a specific embodiment, the present invention provides a method for forming a gallium based crystal. The method includes providing a proto-seed, which has a gallium based crystal with a maximum length of at least 25 mm and a first thickness substantially orthogonal to a first direction of the maximum length and a second thickness orthogonal to the first direction of the maximum length. In a specific embodiment, each of the first thickness and the second thickness is at least 0.5 mm. In a specific embodiment, the method also includes subjecting the proto-seed to an ammonothermal growth of a gallium based crystalline material to cause the proto-seed to grow in a second direction lateral to the first direction of maximum length by a distance of at least 5 mm to form at least one a-wing, comprising a c+ surface and a c-surface. In a specific embodiment, each of the c+ surface and the c-surface has an area of at least 25 mm$^2$. As used herein, the term "lateral" is used in conjunction with a reference direction as shown or other interpretations known by one of ordinary skill in the art. As an example, the term lateral means a direction normal to the original crystal growth direction or other interpretations known by one of ordinary skill in the art. As an example, the proto-seed is a type of seed formed by removing a seed crystal structure from a thick gallium and nitrogen containing substrate made using HVPE growth, is formed by removing a seed crystal structure from a thick gallium and nitrogen containing substrate made using ammonothermal growth, or other techniques.

In a specific embodiment, the present method and resulting device combines several bulk growth methods to grow large area non-polar and semi-polar GaN substrates with high crystalline quality without the characteristic defects associated with epitaxial lateral overgrowth.

In an alternative specific embodiment, the present invention provides a method for forming a gallium based crystal, which may be used for other applications. The method includes providing a laterally grown gallium based seed crystal, which has a maximum length of at least 25 mm and a first thickness substantially orthogonal to a first direction of the maximum length and a second thickness orthogonal to the first direction of the maximum length. Each of the first thickness and the second thickness is at least 0.3 mm. The method includes subjecting the laterally grown gallium based seed crystal to an ammonothermal growth of a gallium based crystalline material to cause the laterally grown gallium based seed crystal to grow in a second direction lateral to the first direction of maximum length by a distance of at least 5 mm to form a c-grown crystal comprising two large-area m-orientation surfaces. Each of the m-surfaces has an area of at least 25 mm$^2$ in a specific embodiment.

In other embodiments, the present invention provides a gallium based crystal device comprising at least four m-plane faces and two c-plane faces; wherein the two c-plane faces are substantial major planes in association with any of the four m-plane faces. In other embodiments, the device also has at least two {1 0 -1 ±1} facets.

Still further, the present invention provides a seed crystal device for use in electronic or optical devices. The seed crystal device includes a seed crystal structure removed from a thickened gallium and nitrogen containing substrate provided from an HVPE grown material; wherein the thickened gallium and nitrogen substrate is at least 500 microns thick. Preferably, the device has at least a pair of major c-plane surfaces.

Moreover, the present invention provides a gallium and nitrogen crystalline structure comprising a laterally grown gallium and nitrogen containing material having a dislocation density of 105 cm−2 and less for a major surface and a major length of 12 mm and greater, the major length associated with the major surface, e.g., a c-plane, an m-plane.

A further understanding of the nature and advantages of the present invention may be realized by reference to the specification and attached drawings.

BRIEF DESCRIPTION OF THE DRAWINGS

FIG. 1a is a simplified diagram illustrating a method of forming a proto-seed crystal according to an embodiment of the present invention;

FIG. 1b is a simplified diagram illustrating a method of forming a proto-seed crystal according to an embodiment of the present invention;

FIG. 2 is a simplified diagram illustrating an optional step of forming a large area GaN crystal according to an embodiment of the present invention;

FIG. 3 is a simplified diagram illustrating a lateral growth process in the a-direction for forming a large area GaN crystal according to an embodiment of the present invention;

FIG. 4 is a simplified diagram illustrating a separation step for forming a large area GaN crystal according to an embodiment of the present invention;

FIG. 5 is a simplified flow diagram illustrating a regrowth step for forming a large area GaN crystal according to an embodiment of the present invention.

FIG. 6 is a simplified diagram illustrating an optional separation step for forming a strip-shaped GaN crystal according to an embodiment of the present invention;

FIG. 7a is a simplified diagram illustrating a side view of a lateral growth process in the c-direction for forming a large area GaN crystal according to an embodiment of the present invention;

FIG. 7b is a simplified diagram illustrating an edge view of a lateral growth process in the c-direction for forming a large area GaN crystal according to an embodiment of the present invention;

FIG. 7c is a simplified diagram illustrating top and bottom views of a lateral growth process in the c-direction for forming a large area GaN crystal according to an embodiment of the present invention; and FIG. 8 is a simplified diagram illustrating a representative crystal morphology following a lateral growth process in the c-direction for forming a large area GaN crystal according to an embodiment of the present invention.

DETAILED DESCRIPTION OF THE INVENTION

According to the present invention, techniques related to techniques for processing materials for manufacture of gallium based substrates are provided. More specifically, embodiments of the invention include techniques for growing large area substrates using a combination of processing techniques. Merely by way of example, the invention can be applied to growing crystals of GaN, AlN, InN, InGaN, AlGaN, and AlInGaN, and others for manufacture of bulk or patterned substrates. Such bulk or patterned substrates can be used for a variety of applications including optoelectronic devices, lasers, light emitting diodes, solar cells, photo electrochemical water splitting and hydrogen generation, photodetectors, integrated circuits, and transistors, and others.

D'Evelyn and co-inventors, in U.S. Pat. No. 7,078,731, hereby incorporated by reference in its entirety, taught methods for growing gallium nitride crystals. We have found that these methods have some limitations. FIG. 5 in this reference and the associated discussion in Col. 10, lines 24-41 teach a method for growing gallium nitride crystals with a low dislocation density that is substantially free of tilt boundaries. Practically speaking, this method requires prolonged growth in directions lateral to the c plane. The family of m planes are typically the slowest-growing facet under ammonothermal growth conditions, so that after long-duration growth the crystals are terminated by m planes in lateral directions, enlargement occurs by means of m-plane growth, and the rate of enlargement is undesirably low. To achieve a crystal diameter of 3 inches, 4 inches, 6 inches, 8 inches, or 12 inches, therefore, may require an impractically long period of time. D'Evelyn also taught lateral enlargement of crystals via growth in the a-direction (see FIG. 11 and the associated discussion in Col. 26, Example 9). However, the HVPE wafers that are commonly used as seed crystals for ammonothermal growth [for example, see M. P. D'Evelyn et al., Mat. Res. Soc. Symp. Proc. 798, Y2.3.1 (2004) and M. P. D'Evelyn et al., J. Cryst. Growth 300, 11 (2007)] may have substantial stresses, strain gradients and bow, which can cause irregular growth and cracking in the laterally-grown GaN material, particularly when the lateral dimensions are large, for example, larger than 2 inches.

FIG. 1a is a simplified diagram 100 illustrating a method for forming a GaN proto-seed crystals. A thick GaN layer is grown on substrate 110 using hydride vapor phase epitaxy (HVPE) or another method that is known in the art, forming boule 120. Substrate 110 may comprise sapphire, silicon carbide, gallium arsenide, $MgAl_2O_4$ spinel, gallium nitride, aluminum nitride, or the like. In a specific embodiment, substrate 110 may be selected from c-plane GaN, c-plane AlN, c-plane sapphire, spinel $MgAl_2O_4$ (111), GaAs(111), Si(111), any combination of these, or the like. Substrate 110 may have a hexagonal crystal structure, with a (0001) c-plane large-area surface orientation. In a specific embodiment, portions of substrate 110 are masked prior to growth of boule 120, enabling growth of material with a reduced dislocation density. In a preferred embodiment, boule 120 has a c-plane orientation and is at least 1 millimeter, at least 2 millimeters, at least 5 millimeters, at least 10 millimeters, at least 15 millimeters, or at least 20 millimeters thick. Substrate 110 and boule 120 may have a diameter that is larger than 25 millimeters, larger than 50 millimeters, larger than 100 millimeters, larger than 150 millimeters, larger than 200 millimeters, or larger than 300 millimeters. Boule 120 may be separated from substrate 110 by self-separation, by laser lift-off, by void-assisted separation, by selective dissolution of substrate 110, or by another method that is known in the art. The top surface of the boule may have a (0001) Ga-face, c-plane orientation, may have an x-ray diffraction co-scan rocking curve full-width-at-half-maximum (FWHM) less than about 50 arcsec or less than about 40 arcsec for the (0002) and/or the (10-12) reflections and may have a dislocation density less than about $10^7$ cm$^{-2}$, less than about $10^6$ cm$^{-2}$, or less than about $10^5$ cm$^{-2}$. In some embodiments, the threading dislocations in the top surface of boule 120 are approximately uniformly distributed. In other embodiments, the threading dislocations in the top surface of boule 120 are arranged inhomogenously as a one-dimensional array of rows of relatively high- and relatively low-concentration regions or as a two-dimensional array of high-dislocation-density regions within a matrix of low-dislocation-density regions. The crystallographic orientation may be constant to less than about 2 degrees, less than about 1 degree, less than about 0.5 degree, less than about 0.2 degree, less than about 0.1 degree, or less than about 0.05 degree across the top surface of the boule. An example of a suitable thick GaN boule is described by Fujito et al., J. Cryst. Growth, 311, 3011 (2009), and by Fujito et al., Mater. Res. Soc. Bull. 34, 313 (2009), which are hereby incorporated by reference in their entirety.

One or more proto-seeds 130 may be prepared from boule 120 by sawing, slicing, cleaving, or the like. In a preferred embodiment, sawcutting is performed parallel to an m-direction, creating strips with long {11-20} surfaces. In some embodiments, the long surfaces prepared by the sawcutting operation have a crystallographic orientation within 10 degrees, within 5 degrees, within 2 degrees, or within 1 degree of an a-plane, {11-20} orientation. In some embodiments, the sawcut or a-plane surfaces are lapped, polished, electrochemically polished, photoelectrochemically polished, reactive-ion-etched, and/or chemical-mechanically polished. The small-area ends of the proto-seeds may have an m-plane, {1-100} orientation, or may have a semi-polar {1-101} or {1-102} orientation. The proto-seed may contain several crystallites separated by low-angle grain boundaries but may be substantially free from coalescence fronts of the type observed in epitaxial lateral overgrowth. Of course, there can be other variations, modifications, and alternatives.

FIG. 1b illustrates an alternative embodiment for preparation of a proto-seed. After growing a thick GaN layer on substrate 110 using hydride vapor phase epitaxy (HVPE) or another method that is known in the art, forming boule 120, boule 120 is sliced into two or more wafers 140. Wafer 140 may have a thickness between about 0.1 millimeter and about 1 millimeter, or between about 0.3 millimeter and about 0.6 millimeter. Wafer 140 may be lapped, polished, electrochemically polished, photoelectrochemically polished, reactive-ion-etched, and/or chemical-mechanically polished. Of course, there can be other variations, modifications, and alternatives. The top surface of at least one wafer 140, and of proto-seed 150, may have a (0001) Ga-face, c-plane orientation, may have an x-ray diffraction co-scan rocking curve full-width-at-half-maximum (FWHM) less than about 50 arcsec or less than about 40 arcsec for the (0002) and/or the (10-12) reflections and may have a dislocation density less than about $10^7$ cm$^{-2}$, less than about $10^6$ cm$^{-2}$, or less than about $10^5$ cm$^{-2}$. The crystallographic orientation may be constant to less than about 2 degrees, less than about 1 degree, less than about 0.5 degree, less than about 0.2 degree, less than about 0.1 degree, or less than about 0.05 degree across the top surface of the boule. One or more proto-seeds 150 may be prepared from wafer 140 by sawing, slicing, cleaving, or the like. In a preferred embodiment, sawcutting is performed parallel to an m-direction, creating strips with long {11-20} surfaces. In some embodiments, the long surfaces prepared by the sawcutting operation have a crystallographic orientation within 10 degrees, within 5 degrees, within 2 degrees, or within 1 degree of an a-plane, {11-20} orientation. In some embodiments, the sawcut or a-plane surfaces are lapped, polished, electrochemically polished, photoelectrochemically polished, reactive-ion-etched, and/or chemical-mechanically polished. The small-area ends of the proto-seeds may have an m-plane, {1-100} orientation, or may have a semi-polar {1-101} or {1-102} orientation. The proto-seed may contain several crystallites separated by low-angle grain boundaries but may be substantially free from coalescence fronts of the type observed in epitaxial lateral overgrowth. Of course, there can be other variations, modifications, and alternatives.

Referring to FIG. 2, the N-face or −c edge of the proto-seed may be trimmed by sawing, laser cutting, cleavage, lapping, or the like, among other techniques. Removal of 0.1-2 mm of the (000-1) edge may allow for removal of the region with the highest dislocation density, so that subsequent crystal growth may start with a dislocation density in the $10^7$ cm$^{-2}$ range or below, rather than in the $10^8$ cm$^{-2}$ to $10^9$ cm$^{-2}$ range. After removal of the edges, the newly formed edges may be lapped, polished, electrochemically polished, photoelectrochemically polished, reactive-ion-etched, and/or chemical-mechanically polished. Of course, there can be other variations, modifications, and alternatives. At least one of the Ga-face (0001) and N-face (000-1) surfaces may be lapped, polished, electrochemically polished, photoelectrochemically polished, reactive-ion-etched, and/or chemical-mechanically polished. The proto-seed may be at least 25 mm, at least 40 mm, at least 50 mm, at least 75 mm, at least 100 mm, at least 125 mm, at least 150 mm, at least 200 mm, or at least 250 mm long in the longest direction, which may be in an m-direction. The proto-seed may be at least 0.3 millimeter, at least 1 millimeter, at least 2 millimeters, at least 5 millimeters, at least 10 millimeters, at least 15 millimeters, or at least 20 millimeters thick in the c-direction. The proto-seed may be at least 0.3 millimeter, at least 1 millimeter, at least 2 millimeters, at least 5 millimeters, at least 10 millimeters, at least 15 millimeters, or at least 20 millimeters wide in the a-direction.

The proto-seed may have a total impurity concentration below $1 \times 10^{18}$ cm$^{-3}$. The proto-seed may have impurity concentrations of oxygen (O), hydrogen (H), carbon (C), sodium (Na), and potassium (K) below $1 \times 10^{17}$ cm$^{-3}$, $2 \times 10^{17}$ cm$^{-3}$, $1 \times 10^{17}$ cm$^{-3}$, $1 \times 10^{16}$ cm$^{-3}$, and $1 \times 10^{16}$ cm$^{-3}$, respectively, as quantified by calibrated secondary ion mass spectrometry (SIMS), glow discharge mass spectrometry (GDMS), interstitial gas analysis (IGA), or the like. In some embodiments the impurity concentration of oxygen is less than $3 \times 10^{16}$ cm$^{-3}$ or less than $1 \times 10^{16}$ cm$^{-3}$. In some embodiments the impurity concentration of hydrogen is less than $1 \times 10^{17}$ cm$^{-3}$ or less than $3 \times 10^{16}$ cm$^{-3}$. In some embodiments the impurity concentration of carbon is less than $3 \times 10^{16}$ cm$^{-3}$, less than $1 \times 10^{16}$ cm$^{-3}$, or less than $3 \times 10^{15}$ cm$^{-3}$. In some embodiments the impurity concentrations of sodium and of potassium are less than $3 \times 10^{15}$ cm$^{-3}$ or less than $1 \times 10^{15}$ cm$^{-3}$. The proto-seed may have impurity concentrations of fluorine (F) and chlorine (Cl) below $1 \times 10^{15}$ cm$^{-3}$ and $1 \times 10^{15}$ cm$^{-3}$, respectively. Of course, there can be other variations, modifications, and alternatives. The proto-seed is substantially free of stacking faults, with a concentration below 100 cm$^{-1}$. Other characteristics may also exist depending upon the specific embodiment.

In crystal growth processes, the impurity levels in seed crystals are similar to those in the crystal that is grown upon the seed. Such a process minimizes strains and possible deleterious effects such as misfit dislocation generation, unstable surface morphologies, and crack formation. Surprisingly, growth of bulk gallium nitride layers with a significant variation in impurity levels does not lead to severe consequences, as long as the variations are not too large, and offers significant benefits. In particular, this relative insensitivity to impurity gradients within a grown, composite gallium nitride crystal enables the crystal grower to take advantage of the different crystallographic growth-rate ratios achievable with different growth techniques and chemistries in order to grow large, high quality gallium nitride crystals. The composite gallium containing crystal may comprise at least a first region and a second region, the composite seed crystal being composed of a gallium containing material, the first region being characterized by a first set of impurity levels or concentrations and the second region being characterized by a second set of impurity levels or concentrations. The transition between the first set of impurity levels and the second set of impurity levels may occur within a transition thickness of less than about 100 microns, less than about 10 microns, or less than about 1 micron. In some embodiments, the composite crystal further comprises a third region, with a third set of impurity levels or concentrations. In still other embodiments, the composite crystal further comprises a fourth region, with a fourth set of impurity levels or concentrations. The transition between the second region and the third region, and/or between the third region and the fourth region, may occur within a transition thickness of less than about 100 microns, less than about 10 microns, or less than about 1 micron. In one or more embodiments, a concentration of at least one of hydrogen, oxygen, sodium, potassium, fluorine, or chlorine differs by at least a factor of three between the first region and the second region, between the second region and the third region, and/or between the third region and the fourth region. In one or more embodiments, a concentration of at least one of hydrogen, oxygen, sodium, potassium, fluorine, or chlorine differs by at least a factor of ten between the first region and the second region, between the second region and the third region, and/or between the third region and the fourth region. The composite gallium containing crystal may be formed using at least two, at least three, or at least four different growth chemistries and/or growth conditions. Again, there can be other variations, modifications, and alternatives.

In a specific embodiment, illustrated schematically in FIG. 3, proto-seed 330 is used as a seed crystal for ammonothermal growth, under conditions favoring growth in the a direction. For example, an opening or hole is laser-cut near one end of the non-polar slice seed crystal. The crystal is hung from a silver wire or other suitable technique inside a silver capsule below a baffle. Polycrystalline GaN raw material, $NH_4F$ mineralizer, and ammonia are added to the capsule with a ratio of approximately 15:1:8.5, but there can be other ratios according to a specific embodiment. The sealed capsule is placed in a cell in a zero-stroke high pressure apparatus or other suitable apparatus. The cell is heated at about 11 degrees Celsius per minute until the temperature of the bottom of the capsule is approximately 700 degrees Celsius and the temperature of the top half of the capsule is approximately 650 degrees Celsius, as measured by type K thermocouples according to a specific embodiment. The temperature of the top half of the heater is then increased until the temperature gradient $\Delta T$ decreases to zero. After holding at $\Delta T=0$ for 1 hour, the temperature of the top half of the capsule is decreased at 5 degrees Celsius per hour until $\Delta T$ increases to approximately 30 degrees Celsius, and the temperatures are held at these values for a predetermined time. In another specific embodiment, the semi-polar slice is used as a seed crystal for ammonothermal growth, under conditions favoring growth in the a direction.

In a specific embodiment, the cell is then cooled and removed from the zero-stroke high pressure apparatus. Cooling occurs by thermal conduction to a water-cooled element within the high pressure apparatus, according to a specific embodiment. The seed crystal grows in the a direction at a rate as high as about 60 micron per hour until the edges of the crystal become terminated by m planes, but can be higher or slightly lower in other applications. The m plane edges and the m-plane thickness of the crystal grow at a rate as high as about 17 microns per hour or greater, or slightly less according to a specific embodiment. In the example shown in FIG. 3, growth takes place principally in the [11-20] and [-1-120] directions, with a lesser amount of growth in the [1-100] and [-1100] directions and in the [0001] and [000-1] directions (latter not shown). The edges of the a planes begin to become terminated by m planes, e.g., (01-10) and (10-10) surrounding a (11-20) facet.

In one set of embodiments, growth on the a-planes occurs homogenously and the cross section of the newly-grown a-sector is greater than or approximately equal to the thickness of the proto-seed in the c-direction. In other embodiments, illustrated in the bottom half of FIG. 3, growth on the a-planes occurs inhomogeneously Inhomogeneous growth may be favored under conditions when a-direction growth is particularly rapid, which may be desired for cost-effective growth of large-area gallium containing crystals. During inhomogeneous a-direction growth the +c and −c edges of the crystal may grow more rapidly in the a-direction than the middle portions of the a planes, forming upper and lower a-wings 340 and 350, respectively. Without wishing to be bound by theory, we believe that a higher rate of growth may originate at the edges due to convective effects as the supercritical ammonia flows over the at least one proto-seed. As the wings on the +c and −c edges of the a plane overgrow the space between them, transport of supercritical ammonia with dissolved gallium-containing precursors into the space is inhibited, resulting in an even greater differential in the a-direction growth rates of the wings relative to the region in between the wings. Inhomogeneous growth of the a-wings may enable growth of higher-quality gallium-containing crystals, as strain between the +c and −c edges of the wings may be greatly reduced or eliminated, and lateral growth of the upper a-wings 340 may occur from the region of the proto-seed 330 with the highest crystallographic quality.

In another embodiment, ammonothermal growth on the proto-seed is performed in an autoclave. In yet another embodiment, ammonothermal growth is performed in an internally-heated high pressure apparatus, as described in U.S. patent applications Ser. Nos. 12/133,364, 12/133365, and 61/075,723, which are hereby incorporated by reference in their entirety.

Referring to FIG. 4, the a-wings 440 and 450 may be separated from the proto-seed 430 by sawing, laser-cutting, slicing, cleaving, or the like. Cuts or slices may be performed parallel and proximal to the original a faces of the proto-seed 430. If inhomogeneous growth has occurred the +c and −c a-wings 440 and 450 may be separated from each other by sawing, laser-cutting, slicing, cleaving, or the like. The newly exposed surfaces, which may have an a {11-20} or a ±c (0001)/(000-1) orientation, may be lapped, polished, electrochemically polished, photoelectrochemically polished, reactive-ion-etched, and/or chemical-mechanically polished. In some embodiments, as shown in FIG. 4, separation of a-wings 440 and 450 is performed after they are grown out to a half-rhombus shape. In other embodiments, separation of a-wings 440 and 450 from proto-seed 430 is performed before a-wings have fully grown out to a half-rhombus shape. For example, referring to FIG. 3, the a-wings may be separated after performing an intermediate degree of lateral growth, as shown schematically in the middle panel of FIG. 3. For example, the a-wings may be separated after performing between about 0.5 mm and about 5 mm of lateral growth from proto-seed 330 or 430.

Referring to FIG. 5, one or more a-wings 540 may be used as a seed crystal for ammonothermal growth, under conditions favoring growth in the a direction. The growth rate in the a-direction may be significantly larger than the growth rates in the m-direction or c-directions, resulting in a substantially rhombus-shaped crystal 570 comprising original a-wing 540 and newly-grown a-wing 560. If the thickness of a-wing 540 was non-uniform, for example, due to inhomogeneous growth in the a-direction, the variation in thickness may persist in growth of the rhombus-shaped crystal 570. If a-wing 540 was separated from the proto-seed prior to growing out to a full half-rhombus shape, a-direction growth may occur simultaneously on both a-edges of a-wing 540. The total extent of lateral growth, during at least one growth run, but possibly two, three, or more growth runs, may be greater than about 5 millimeters, greater than about 7.5 millimeters, greater than about 10 millimeters, greater than about 15 millimeters, greater than about 20 millimeters, greater than about 25 millimeters, greater than about 30 millimeters, greater than about 40 millimeters, or greater than about 50 millimeters. The original proto-seed 430, possibly with additional, epitaxially-grown material on the c-faces, a-faces, m-faces, and other faces, if present, may be used as a seed crystal for ammonothermal growth, under conditions favoring growth in the a direction. Ammonothermal growth on the re-grown proto-seed may be performed simultaneously, in the same apparatus, as growth on a-wing 540.

Rhombus crystal 570 may have a longest lateral dimension between about 25 millimeters and about 300 millimeters. Rhombus crystal 570 may have included angles of approximately 60 degrees or 120 degrees between adjacent m-plane facets. Rhombus crystal 570 may have a thickness between about 0.2 millimeter and about 25 millimeters. Rhombus crystal 570, which has been completely grown laterally with respect to the original c-plane proto-seed crystal, may have a c-plane dislocation density of about $10^0$-$10^5$ cm$^{-2}$ and a crystallographic radius of curvature greater than about 10 meters, greater than about 20 meters, greater than about 50 meters, or greater than about 100 meters. Rhombus crystal 570 may have an a-plane dislocation density that is greater by more than a factor of 10, greater by more than a factor of 100, or greater by more than a factor of 1000 than the dislocation density in a c-plane. In a specific embodiment, the top and bottom surfaces of the rhombus crystal may have impurity concentrations of O, H, C, Na, and K between about $1\times10^{17}$ cm$^{-3}$ and $1\times10^{19}$ cm$^{-3}$, between about $1\times10^{17}$ cm$^{-3}$ and $2\times10^{19}$ cm$^{-3}$, below $1\times10^{17}$ cm$^{-3}$, below $1\times10^{16}$ cm$^{-3}$, and below $1\times10^{16}$ cm$^{-3}$, respectively, as quantified by calibrated secondary ion mass spectrometry (SIMS). In another embodiment, the top and bottom surfaces of the rhombus crystal may have impurity concentrations of O, H, C, and at least one of Na and K between about $1\times10^{17}$ cm$^{-3}$ and $1\times10^{19}$ cm$^{-3}$, between about $1\times10^{17}$ cm$^{-3}$ and $2\times10^{19}$ cm$^{-3}$, below $1\times10^{17}$ cm$^{-3}$, and between about $3\times10^{15}$ cm$^{-3}$ and $1\times10^{18}$ cm$^{-3}$, respectively, as quantified by calibrated secondary ion mass spectrometry (SIMS). In still another embodiment, the top and bottom surfaces of the rhombus crystal may have impurity concentrations of O, H, C, and at least one of F and Cl between about $1\times10^{17}$ cm$^{-3}$ and $1\times10^{19}$ cm$^{-3}$, between about $1\times10^{17}$ cm$^{-3}$ and $2\times10^{19}$ cm$^{-3}$, below $1\times10^{17}$ cm$^{-3}$, and between about $1\times10^{15}$ cm$^{-3}$ and $1\times10^{17}$ cm$^{-3}$, respectively, as quantified by calibrated secondary ion mass spectrometry (SIMS). In some embodiments, the top and bottom surfaces of the rhombus crystal may have impurity concentrations of H between about $5\times10^{17}$ cm$^{-3}$ and $1\times10^{19}$ cm$^{-3}$, as quantified by calibrated secondary ion mass spectrometry (SIMS). In a specific embodiment, the rhombus crystal has an infrared absorption peak at about 3175 cm$^{-1}$, with an absorbance per unit thickness of greater than about 0.01 cm$^{-1}$. The rhombus crystal may contain several crystallites separated by low-angle grain boundaries but may be free from coalescence fronts of the type observed in epitaxial lateral overgrowth. In some embodiments, one or more corners of rhombus crystal 570 are missing but much of the rhombus outline is present, so that the crystal is substantially rhombus-shaped.

In a specific embodiment, the top surface of the rhombus crystal may be oriented to within 10 degrees, within 5 degrees, within 2 degrees, within 1 degree, within 0.3 degree, or within 0.1 degree of the (0001) Ga-face, c-plane orientation, may have an x-ray diffraction co-scan rocking curve full-width-at-half-maximum (FWHM) less than about 40 arcsec, less than about 30 arcsec, or less than about 20 arcsec for the (0002) and/or the (10-12) reflections and may have a dislocation density less than about $10^5$ cm$^{-2}$, less than about $10^4$ cm$^{-2}$, less than about $10^3$ cm$^{-2}$, less than about $10^2$ cm$^{-2}$, or less than about 10 cm$^{-2}$. The crystallographic orientation may be constant to less than about less than about 1 degree, less than about 0.5 degree, less than about 0.2 degree, less than about 0.1 degree, or less than about 0.05 degree across the top surface of the rhombus crystal.

In a specific embodiment, the rhombus crystal is lapped, polished, electrochemically polished, photoelectrochemically polished, reactive-ion-etched, and/or chemical-mechanically polished according to methods that are known in the art. In another specific embodiment, the rhombus crystal is sliced approximately parallel to a large area surface to form one or more wafers. The wafers may be lapped, polished, electrochemically polished, photoelectrochemically polished, reactive-ion-etched, and/or chemical-mechanically polished according to methods that are known in the art.

In one specific embodiment, the rhombus crystal or a wafer formed therefrom is then used as a seed crystal or substrate for further bulk crystal growth, for example, for flux growth, or for HVPE growth. Some dislocations may form at or near the interface between the rhombus crystal and the newly grown GaN material and propagate in the growth direction. However, their concentration is relatively low, for example, below about $10^5$ cm$^{-2}$, below about $10^4$ cm$^{-2}$, below about $10^3$ cm$^{-2}$, below about $10^2$ cm$^{-2}$, or below about 10 cm$^{-2}$.

In another specific embodiment, illustrated schematically in FIG. 6, rhombus crystal 670 is separated into laterally-grown, strip-shaped crystals 680 by sawing, laser-cutting, slicing, cleaving, or the like. In some embodiments, the separation is performed approximately parallel to m-planes. Optionally, the newly created m-surfaces may be lapped, polished, electrochemically polished, photoelectrochemically polished, reactive-ion-etched, and/or chemical-mechanically polished according to methods that are known in the art. The strip-shaped crystals may be characterized by an upper (0001) surface, a lower (000-1) surface and four principal edges, all of which have an m-plane orientation. The length or maximum dimension of the strip-shaped crystals may be larger, by a factor of 5 or larger, a factor of 10 or larger, or a factor of 20 or larger, than the thickness and the width.

In another specific embodiment, laterally-grown strip-shaped crystals are prepared by slicing an a-wing or a rhombus-shaped crystal prepared by ammonothermal growth from a non gallium-based seed crystal, for example by the method described by Poblenz et al. in U.S. patent application Ser. No. 12/556,562 filed Sep. 9, 2009, which is hereby incorporated by reference in its entirety. Other means for preparing laterally-grown gallium based crystals are also possible.

In a specific embodiment, illustrated schematically in FIGS. 7a, 7b, and 7c, at least one strip-shaped crystal 780 or laterally-grown gallium based crystal is used as a seed crystal for ammonothermal growth under conditions favoring growth in the +c and/or −c directions. For example, if it is not already present, a hole (or opening or recessed region) may be laser-cut near one end or both ends of the strip-shaped seed crystal. The crystal is hung from a silver wire or other suitable technique inside a silver capsule below a baffle. Polycrystalline GaN raw material, $GaF_3$ mineralizer, and ammonia are added to the capsule with a ratio of approximately 10:1.1:8.5, but there can be other ratios according to a specific embodiment. The sealed capsule is placed in a cell in a zero-stroke high pressure apparatus or other suitable techniques. The cell is heated until the temperature of the bottom of the capsule is approximately 750 degrees Celsius and the temperature of the top half of the capsule is approximately 705 degrees Celsius, as measured by type K thermocouples. The temperatures are held at these values for a predetermined period of time. The cell is then cooled and removed from the zero-stroke high pressure apparatus. The seed crystal grows in the +c and −c directions at a rate of at least about 10 microns per hour. The two crystallographic directions are inequivalent in GaN, so the growth rates in the two directions may or may not be the same. Growth in the −c and −c directions may be continued until the dimension of the c-grown crystal along the c axis is within a factor of two, or approximately equal, to the length of the strip-shaped crystal or the largest width of the crystal in a direction perpendicular to the c axis.

The c-grown crystal may be terminated predominantly by two large m faces, by at least two smaller m faces, by two smaller c faces, and by at least two semipolar {10-1±1} faces, as shown schematically in FIGS. 7a, 7b, 7c, and 8. The area of each of the two largest m faces may be larger, by a factor of at least 3, at least 5, at least 10, at least 20, or at least 30, than the c faces. The total area of each of two smaller m faces may be equal, to within a factor of 1.5, a factor of 2, or a factor of 3, to the total area of the +c and −c faces. The total area of the semipolar {10-1-1} faces may be larger, by a factor of at least 1.5, a factor of at least 2, or a factor of at least 3, than the total area of the {10-11} faces.

In some embodiments, the c-grown crystal may be characterized by having two large m faces and four smaller m faces, the latter of whose areas are approximately equal, to within a factor of three or within a factor of two, rather than only two smaller m faces, as illustrated schematically in FIGS. 7a, 7b, 7c, and 8.

The c-grown crystal may contain several crystallites separated by low-angle grain boundaries but may be substantially free from coalescence fronts of the type observed in epitaxial lateral overgrowth. The c-grown crystal may have impurity concentrations of O, H, C, Na, and K below about $1\times10^{17}$ $cm^{-3}$, $2\times10^{17}$ $cm^{-3}$, $1\times10^{17}$ $cm^{-3}$, $1\times10^{16}$ $cm^{-3}$, and $1\times10^{16}$ $cm^{-3}$, respectively, as quantified by calibrated secondary ion mass spectrometry (SIMS), glow discharge mass spectrometry (GDMS), interstitial gas analysis (IGA), or the like. The c-grown crystal may have impurity concentrations of O, H, C, Na, and K between about $1\times10^{17}$ $cm^{-3}$ and $1\times10^{19}$ $cm^{-3}$, between about $1\times10^{17}$ $cm^{-3}$ and $2\times10^{19}$ $cm^{-3}$, below $1\times10^{17}$ $cm^{-3}$, below $1\times10^{16}$ $cm^{-3}$, and below $1\times10^{16}$ $cm^{-3}$, respectively, as quantified by calibrated secondary ion mass spectrometry (SIMS). In another embodiment, the c-grown crystal may have impurity concentrations of O, H, C, and at least one of Na and K between about $1\times10^{17}$ $cm^{-3}$ and $1\times10^{19}$ $cm^{-3}$, between about $1\times10^{17}$ $cm^{-3}$ and $2\times10^{19}$ $cm^{-3}$, below $1\times10^{17}$ $cm^{-3}$, and between about $3\times10^{15}$ $cm^{-3}$ and $1\times10^{18}$ $cm^{-3}$, respectively, as quantified by calibrated secondary ion mass spectrometry (SIMS). In still another embodiment, the c-grown crystal may have impurity concentrations of O, H, C, and at least one of F and Cl between about $1\times10^{17}$ $cm^{-3}$ and $1\times10^{19}$ $cm^{-3}$, between about $1\times10^{17}$ $cm^{-3}$ and $2\times10^{19}$ $cm^{-3}$, below $1\times10^{17}$ $cm^{-3}$, and between about $1\times10^{15}$ $cm^{-3}$ and $1\times10^{17}$ $cm^{-3}$, respectively, as quantified by calibrated secondary ion mass spectrometry (SIMS).

In a specific embodiment, the c-grown crystal is characterized by a FWHM of the 1-100 x-ray rocking curve of at least one of the large area m-plane surfaces below 50 arcsec, below 40 arcsec, below 30 arcsec, or below 20 arcsec. The dislocation density on at least one large-area m-plane surface may be below $10^6$ $cm^{-2}$, below $10^5$ $cm^{-2}$, below $10^4$ $cm^{-2}$, below $10^3$ $cm^{-2}$, or below $10^2$ $cm^{-2}$. The dislocation density through a c-plane in the c-grown crystal may be below $10^5$ $cm^{-2}$, below $10^4$ $cm^{-2}$, below $10^3$ $cm^{-2}$, or below $10^2$ $cm^{-2}$. The c-grown crystal may have a crystallographic radius of curvature greater than about 10 meters, greater than about 20 meters, greater than about 50 meters, or greater than about 100 meters.

In some embodiments, the c-grown crystal is used as a seed crystal for further bulk growth. In one specific embodiment, the further bulk growth comprises ammonothermal bulk crystal growth. In another specific embodiment, the further bulk growth comprises high temperature solution crystal growth, also known as flux crystal growth. In yet another specific embodiment, the further bulk growth comprises HYPE. The further-grown crystal may be sliced, polished, and/or chemically-mechanically polished into wafers by methods that are known in the art.

The wafer may be incorporated into a semiconductor structure. The semiconductor structure may comprise at least one $Al_xIn_yGa_{(1-x-y)}N$ epitaxial layer, where 0≤x, y, x+y≤1. The epitaxial layer may be deposited on the wafer, for example, by metalorganic chemical vapor deposition (MOCVD) or by molecular beam epitaxy (MBE), according to methods that are known in the art. The semiconductor structure may form a portion of a gallium-nitride-based electronic device or optoelectronic device, such as a light emitting diode, a laser diode, a photodetector, an avalanche photodiode, a photovoltaic, a solar cell, a cell for photoelectrochemical splitting of water, a transistor, a rectifier, and a thyristor; one of a transistor, a rectifier, a Schottky rectifier, a thyristor, a p-i-n diode, a metal-semiconductor-metal diode, high-electron mobility transistor, a metal semiconductor field effect transistor, a metal oxide field effect transistor, a power metal oxide semiconductor field effect transistor, a power metal insulator semiconductor field effect transistor, a bipolar junction transistor, a metal insulator field effect transistor, a heterojunction bipolar transistor, a power insulated gate bipolar transistor, a power vertical junction field effect transistor, a cascade switch, an inner sub-band emitter, a quantum well infrared photodetector, a quantum dot infrared photodetector, and combinations thereof. The gallium-nitride-based electronic device or optoelectronic device may be incorporated into a fixture, such as a luminaire.

The above sequence of steps provides a method according to an embodiment of the present invention. In a specific embodiment, the present invention provides a method and resulting crystalline material provided by a high pressure apparatus having structured support members. Other alternatives can also be provided where steps are added, one or more steps are removed, or one or more steps are provided in a different sequence without departing from the scope of the claims herein.

As an example, the crystal structures includes various impurity levels. The c-grown crystal has impurity concentrations of O, H, C, Na, and K below about 1×1017 cm–3, 2×1017 cm–3, 1×1017 cm–3, 1×1016 cm–3, and 1×1016 cm–3, respectively. In a specific embodiment, the c-grown crystal has impurity concentrations of O, H, C, Na, and K between about 1×1017 cm–3 and 1×1019 cm–3, between about 1×1017 cm–3 and 2×1019 cm–3, below 1×1017 cm–3, below 1×1016 cm–3, and below 1×1016 cm–3, respectively. In other embodiments, the c-grown crystal has impurity concentrations of O, H, C, and at least one of Na and K between about 1×1017 cm–3 and 1×1019 cm–3, between about 1×1017 cm–3 and 2×1019 cm–3, below 1×1017 cm–3, and between about 3×1015 cm–3 and 1×1018 cm–3, respectively. In further embodiments, the c-grown crystal has impurity concentrations of O, H, C, and at least one of F and Cl between about 1×1017 cm–3 and 1×1019 cm–3, between about 1×1017 cm–3 and 2×1019 cm–3, below 1×1017 cm–3, and between about 1×1015 cm–3 and 1×1017 cm–3, respectively. In still other embodiments, the c-grown crystal is characterized by a FWHM of the 1-100 x-ray rocking curve of at least one of the large area m-plane surfaces below 50 arcsec, a dislocation density on at least one large-area m-plane surface below 106 cm–2, and a dislocation density through a c-plane in the c-grown crystal below about 105 cm–2. In yet other embodiments, the c-grown crystal has an infrared absorption peak at about 3175 cm–1, with an absorbance per unit thickness of greater than about 0.01 cm–1. In yet other embodiments, the c-grown crystal has a crystallographic radius of curvature greater than about 20 meters. In other embodiments, the present technique includes slicing the c-grown crystal approximately parallel to a large area surface to form one or more wafers and optionally utilizing the c-grown crystal or a wafer prepared therefrom as a seed crystal or substrate for further bulk crystal growth. In other embodiments, the method utilizes the c-grown crystal or a wafer prepared therefrom as a substrate for preparation of a semiconductor structure, which has at least one AlxInyGa(1-x-y)N epitaxial layer, where 0≤x, y, x+y≤1. Again, one of more of these various may be included.

In preferred embodiments, the present semiconductor material and structure may be incorporated in to one or more applications. As an example, the applications include a gallium-nitride-based electronic device or optoelectronic device, the gallium-nitride-based electronic device or optoelectronic device being selected from a light emitting diode, a laser diode, a photodetector, an avalanche photodiode, a photovoltaic, a solar cell, a cell for photoelectrochemical splitting of water, a transistor, a rectifier, and a thyristor; one of a transistor, a rectifier, a Schottky rectifier, a thyristor, a p-i-n diode, a metal-semiconductor-metal diode, high-electron mobility transistor, a metal semiconductor field effect transistor, a metal oxide field effect transistor, a power metal oxide semiconductor field effect transistor, a power metal insulator semiconductor field effect transistor, a bipolar junction transistor, a metal insulator field effect transistor, a heterojunction bipolar transistor, a power insulated gate bipolar transistor, a power vertical junction field effect transistor, a cascade switch, an inner sub-band emitter, a quantum well infrared photodetector, a quantum dot infrared photodetector, and combinations thereof.

While the above is a full description of the specific embodiments, various modifications, alternative constructions and equivalents may be used. Therefore, the above description and illustrations should not be taken as limiting the scope of the present invention which is defined by the appended claims.

What is claimed is:

1. A method for forming a gallium based crystal, comprising:
    providing a gallium based seed crystal, wherein
        the gallium based seed crystal comprises at least one of a +c-plane surface and a –c-plane surface, and
        at least one of the +c-plane surface and the –c-plane surface is bounded by four m-plane edges; and
    subjecting the gallium based seed crystal to an ammonothermal growth process to cause the gallium based seed crystal to grow in at least one of a +c direction and a –c direction by at least about 5 mm to form a c-grown gallium based crystal comprising at least four m-plane surfaces and at least one ±c-plane surface, wherein
        at least two of the at least four m-plane surfaces of the c-grown gallium based crystal each have an area larger than the at least one ±c-plane surface of the c-grown gallium based crystal.

2. The method of claim 1, wherein each of the at least one of the +c-plane surface and the –c-plane surface of the gallium based seed crystal has a length that is parallel to at least one of the four m-plane edges and is perpendicular to a width, and
    the length is larger than the width by a factor of 5 or more.

3. The method of claim 1, wherein the c-grown gallium based crystal has impurity concentrations of O, H, C, Na, and K between about $1\times10^{17}$ cm$^{-3}$ and $1\times10^{19}$ cm$^{-3}$, between about $1\times10^{17}$ cm$^{-3}$ and $2\times10^{19}$ cm$^{-3}$, below $1\times10^{17}$ cm$^{-3}$, below $1\times10^{16}$ cm$^{-3}$, and below $1\times10^{16}$ cm$^{-3}$, respectively.

4. The method of claim 1, wherein the c-grown gallium based crystal has impurity concentrations of O, H, C, and at least one of Na and K between about $1\times10^{17}$ cm$^{-3}$ and $1\times10^{19}$ cm$^{-3}$, between about $1\times10^{17}$ cm$^{-3}$ and $2\times10^{19}$ cm$^{-3}$, below $1\times10^{17}$ cm$^{-3}$, and between about $3\times10^{15}$ cm$^{-3}$ and $1\times10^{18}$ cm$^{-3}$, respectively.

5. The method of claim 1, wherein the c-grown gallium based crystal has impurity concentrations of O, H, C, and at least one of F and Cl between about $1\times10^{17}$ cm$^{-3}$ and $1\times10^{19}$ cm$^{-3}$, between about $1\times10^{17}$ cm$^{-3}$ and $2\times10^{19}$ cm$^{-3}$, below $1\times10^{17}$ cm$^{-3}$, and between about $1\times10^{15}$ cm$^{-3}$ and $1\times10^{17}$ cm$^{-3}$, respectively.

6. The method of claim 1, wherein the c-grown gallium based crystal is characterized by a FWHM of a 1-100 x-ray rocking curve of at least one of the at least four m-plane surfaces below 50 arcsec, a dislocation density on at least one large-area m-plane surface below $10^6$ cm$^{-2}$, and a dislocation density through a c-plane in the c-grown gallium based crystal below about $10^5$ cm$^{-2}$.

7. The method of claim 1, wherein the c-grown gallium based crystal has an infrared absorption peak at about 3175 cm$^{-1}$, with an absorbance per unit thickness of greater than about 0.01 cm$^{-1}$.

8. The method of claim 1, wherein the c-grown gallium based crystal has a crystallographic radius of curvature greater than about 20 meters.

9. The method of claim 1, further comprising slicing the c-grown gallium based crystal approximately substantially parallel to a large area surface to form one or more wafers.

10. The method of claim 1, further comprising utilizing the c-grown gallium based crystal or a wafer prepared therefrom as a seed crystal or substrate for further bulk crystal growth.

11. The method of claim 9, wherein the one or more wafers comprise a semiconductor structure, the semiconductor structure comprising at least one $Al_X In_Y Ga_{(1-X-Y)}N$ epitaxial layer, where 0≤x, y, x+y≤1.

12. The method of claim 11, further comprising using the semiconductor structure in a gallium-nitride-based electronic device or optoelectronic device, the gallium-nitride-based electronic device or optoelectronic device being selected from a light emitting diode, a laser diode, a photodetector, an avalanche photodiode, a photovoltaic, a solar cell, a cell for photoelectrochemical splitting of water, a transistor, a rectifier, a thyristor, a Schottky rectifier, a p-i-n diode, a metal-semiconductor-metal diode, high-electron mobility transistor, a metal semiconductor field effect transistor, a metal oxide field effect transistor, a power metal oxide semiconductor field effect transistor, a power metal insulator semiconductor field effect transistor, a bipolar junction transistor, a metal insulator field effect transistor, a heterojunction bipolar transistor, a power insulated gate bipolar transistor, a power vertical junction field effect transistor, a cascade switch, an inner sub-band emitter, a quantum well infrared photodetector, a quantum dot infrared photodetector, or combinations thereof.

13. The method of claim 1, wherein the c-grown gallium based crystal comprises at least two semipolar {10-11} surfaces and at least two semipolar {10-1-1} surfaces, wherein the total area of the at least two semipolar {10-1-1} surfaces is larger, by a factor of at least 1.5, than the total area of the at least two semipolar {10-11} surfaces.

14. The method of claim 1, wherein the ammonothermal growth process includes the use of polycrystalline GaN material and a mineralizer comprising at least one of fluorine (F) and chlorine (Cl).

15. The method of claim 1, wherein the ammonothermal growth process is performed at a temperature of at least 650 degrees Celsius.

16. The method of claim 10, further comprising
preparing one or more wafers from the seed crystal formed by the further bulk crystal growth.

17. The method of claim 10, wherein the further bulk crystal growth comprises HVPE growth.

18. The method of claim 1, wherein the gallium based seed is prepared by a process using a c-plane GaN layer that was formed on a sapphire or gallium arsenide substrate, with a thickness of at least 1 mm.

19. The method of claim 16, wherein the one or more wafers comprise a semiconductor structure, the semiconductor structure comprising at least one $Al_X In_Y Ga_{(1-X-Y)}N$ epitaxial layer, where 0≤x, y, x+y≤1.

20. A method for forming a gallium based crystal, comprising:
providing a first gallium based seed crystal, wherein
the first gallium based seed crystal comprises at least one of a +c-plane surface and a −c-plane surface, has a length along at least one of the edges of the +c-plane surface or the −c plane surface that is larger than a width that is perpendicular to the length by a factor of 5 or more, and was prepared from a gallium-based crystal that was grown by an ammonothermal process in at least one a-direction on a second gallium based seed crystal having a maximum dimension in an m-direction that is greater than a maximum dimension in one of a +c and a −c directions; and
subjecting the first gallium based seed crystal to an ammonothermal growth process to cause the gallium based seed crystal to grow in the at least one of the +c and the −c directions by at least about 5 mm to form a c-grown gallium based crystal comprising at least four m-plane surfaces and at least one ±c-plane surfaces, wherein two of the at least four m-plane surfaces each have an area larger than each of the at least one ±c-plane surfaces.

* * * * *